United States Patent
Singh et al.

(10) Patent No.: US 8,810,189 B2
(45) Date of Patent: Aug. 19, 2014

(54) MACHINE SYSTEMS INCLUDING PRE-POWER DIAGNOSTICS

(75) Inventors: Brij N. Singh, West Fargo, ND (US); Chris J. Tremel, West Fargo, ND (US); Alan K. Gilman, West Fargo, ND (US)

(73) Assignee: Deere & Company, Moline, IL (US)

(*) Notice: Subject to any disclaimer, the term of this patent is extended or adjusted under 35 U.S.C. 154(b) by 454 days.

(21) Appl. No.: 13/052,767

(22) Filed: Mar. 21, 2011

(65) Prior Publication Data

US 2012/0217920 A1 Aug. 30, 2012

Related U.S. Application Data

(60) Provisional application No. 61/446,539, filed on Feb. 25, 2011, provisional application No. 61/454,690, filed on Mar. 21, 2011.

(51) Int. Cl.
*H02P 27/04* (2006.01)

(52) U.S. Cl.
USPC . 318/801; 318/563; 318/400.21; 318/400.26; 318/400.27; 700/143; 361/21; 361/23; 361/43; 701/39; 701/43; 701/76; 701/97; 701/107; 702/108; 702/128; 363/40; 363/56.03; 369/53.42

(58) Field of Classification Search
USPC ............... 318/400.01, 400.04, 560, 565, 721, 318/800, 801, 563, 400.21, 400.22, 400.26, 318/400.27, 603, 722, 490, 400.28, 400.29; 363/40, 56.03; 341/128, 129; 123/479; 700/143; 327/20; 701/31.8, 33.5, 39, 701/43, 62, 76, 92, 97, 107; 702/108, 128; 369/53.42; 361/21, 23, 43, 88
See application file for complete search history.

(56) References Cited

U.S. PATENT DOCUMENTS

| | | | |
|---|---|---|---|
| 4,023,083 | A | 5/1977 | Plunkett |
| 4,814,677 | A | 3/1989 | Plunkett |
| 5,428,283 | A | 6/1995 | Kalman et al. |
| 5,486,748 | A | 1/1996 | Konrad et al. |
| 5,914,582 | A | 6/1999 | Takamoto et al. |
| 6,275,000 | B1 | 8/2001 | Nishimura |

(Continued)

OTHER PUBLICATIONS

S. Van Haute et al., "Design and Control of a Permanent Magnet Synchronous Motor Drive for a Hybrid Electric Vehicle," Katholieke University Leauven, Belgium.

(Continued)

*Primary Examiner* — Antony M Paul
(74) *Attorney, Agent, or Firm* — Harness, Dickey & Pierce, P.L.C.

(57) ABSTRACT

Example embodiments disclose a drive system including a machine including a plurality of phases and configured to generate power based on a plurality of phase currents, each respectively associated with the plurality of phases and a direct current (DC) bus, operatively connected to the machine. The DC bus includes a high-side line, a low-side line, and an inverter including a plurality of switching systems, operatively connected between the high-side line and the low-side line, the plurality of switching systems, each configured to output a respective one of the plurality of phase currents. The drive system also includes a controller, operatively connected to the DC bus and the machine, the controller configured to determine if a failure exists in the drive system based on the plurality of phase currents and a DC bus voltage, the DC bus voltage being a voltage across the high-side line and the low-side line.

18 Claims, 8 Drawing Sheets

(56) References Cited

U.S. PATENT DOCUMENTS

| | | | |
|---|---|---|---|
| 6,335,608 | B1 | 1/2002 | Takahashi |
| 7,045,988 | B2 | 5/2006 | Ha et al. |
| 7,109,605 | B2 * | 9/2006 | Habu .......................... 307/39 |
| 7,157,878 | B2 | 1/2007 | Collier-Hallman |
| 7,279,862 | B1 | 10/2007 | Welchko et al. |
| 7,733,044 | B2 | 6/2010 | Nakamura et al. |
| 8,040,081 | B2 * | 10/2011 | Shimana ........................ 318/34 |
| 8,045,301 | B2 * | 10/2011 | Shiba et al. ..................... 361/23 |
| 8,232,752 | B2 * | 7/2012 | Kezobo et al. ........... 318/400.06 |
| 8,598,837 | B2 * | 12/2013 | Kitanaka et al. .............. 318/801 |
| 2006/0247829 | A1 | 11/2006 | Sato |
| 2008/0061728 | A1 | 3/2008 | Tomigashi |
| 2008/0067960 | A1 * | 3/2008 | Maeda et al. ............ 318/400.02 |
| 2008/0129238 | A1 | 6/2008 | Anderson |
| 2010/0060222 | A1 | 3/2010 | Kezobo et al. |
| 2011/0163708 | A1 * | 7/2011 | Mukai et al. .................. 318/722 |
| 2011/0204839 | A1 * | 8/2011 | Mukai et al. .................. 318/724 |

OTHER PUBLICATIONS

M. Elbuluk and M. Kankam, "Speed Sensorless Induction Motor Devices for Electrical Actuators: Schemes, Trends and Tradeoffs," National Aerospace and Electronics Conference cosponsored by IEEE, Wright-Patterson AFB, Dayton, OH, Jul. 14-18, 1997.

S. Van Haute et al., "Design and Control of a Permanent Magnet Synchronous Motor Drive for a Hybrid Electric Vehicle," Katholieke University Leuven, Belgium, Sep. 1997.

International Preliminary Report on Patentability dated Sep. 6, 2013.

International Search Report and Written Opinion dated May 25, 2012.

US 7,595,604, 09/2009, Tomigashi (withdrawn)

* cited by examiner

MACHINE SYSTEMS INCLUDING PRE-POWER DIAGNOSTICS

PRIORITY STATEMENT

This application claims the benefit under 35 U.S.C. §119 of U.S. Provisional Application Nos. 61/446,539, filed Feb. 25, 2011, and 61/454,690, entitled SYSTEM FOR DETECTING A FAILURE ASSOCIATED WITH AN INVERTER OR ASSOCIATED MACHINE, invented by Brij N. Singh, filed Mar. 21, 2011, the entire contents of each of which are incorporated herein by reference.

FIELD

Example embodiments relate to pre-power diagnostics of inverter-fed machine systems for real-time failure detection, such as in the field of electric and hybrid vehicles and equipment.

BACKGROUND

It is known for a drive system for an electric or hybrid vehicle to have an engine (e.g., internal combustion engine), a generator coupled to the engine, a Direct Current (DC) bus, and a motor. The DC bus is coupled electrically between the generator and the motor to drive one or more elements of the vehicle. A converter is coupled electrically between the generator and the DC bus and is controlled to convert Alternating Current (AC) power into DC power during generating of the generator and DC power into AC power during motoring of the motor. The motor can be a Switched Reluctance (SR) motor, a Permanent Magnet (PM) AC Motor or an Induction AC Motor.

In an inverter-fed drive system, a power inverter is coupled electrically between the DC bus and the motor and is controlled to convert DC power from the DC bus into AC power during motoring of the motor and to convert AC power into DC power during electric braking of the motor. In vehicles with regenerative braking, the inverter also takes power from the motor (now acting as a generator) and stores it in batteries. A voltage sensor is coupled electrically to the DC bus to sense a DC bus voltage and output a DC bus voltage signal indicative thereof. A current sensor senses a phase current of the motor and outputs a phase current signal indicative thereof. A control system is coupled electrically to the voltage sensor and the current sensor to receive signals from the sensors pertaining to system operation.

In an inverter-fed electric drive system, it can be appreciated that a variety of failures can occur in the various power and control components used in the systems, such as, Insulated Gate Bi-polar Transistors (IGBTs) in the inverters, diodes in the inverters, electric machines, motor windings, dc bus capacitors, power cables between inverters and electric machines, etc.

SUMMARY

Example embodiments propose a novel monitoring and control technique for inverter-fed machine systems. Pre-power diagnostics of electric machinery done at low voltage levels can detect incipient failures before the system is operated under full power, significantly reducing the cost of maintenance and the risk of unexpected failures at high voltage. In example embodiments, a failure may include an open circuit or a failure and is not limited to these two types of failures.

Example embodiments disclose at least two different methods that can be used for pre-power diagnostics of the system. A first method, which may be used for PM, Induction, or SR motors, utilizes measurements of sensed signal levels to determine if there is a failure in the system. It should be understood that "signal level" may refer to either a measured phase voltage or a measured phase current. It is possible to convert a measured phase voltage to a phase current with a transconductance amplifier or transresistance amplifier (e.g., op-amplifier plus a resistor). For the sake of brevity, the first method is described using measured phase currents as the signal levels. However, it should be understood that the first method may be implemented using measured phase voltages.

A second method, for systems having PM, Induction, or SR motors, utilizes measurements of sensed voltage at the AC mid-point voltage measured between high-side and low-side devices in an inverter leg with respect to the negative DC bus to determine if there is a failure in the system. The sensed voltages are processed in the Analog-to-Digital Converter (ADC) that is built into the Gate Drivers of the control system. This data is considered as ADC count data. This method compares the ADC count data to switching signals of the devices to identify and locate failures in the system.

Additionally, the pre-existing presence of a control system and voltage and current sensors in inverters used for standard operation mean that condition monitoring algorithms for pre-power diagnostics can be implemented with little incremental cost, and typically require little other than a software upgrade or a software sub-routine.

By relying on the information provided by pre-power monitoring and diagnostics to assess the machine's condition and identify failures, and future failures, cascading and catastrophic failures in the system can be prevented, thereby saving significant money and preventing system down-time.

The detection of failures in inverter-driven machines is challenging due to noise created by high switching frequency. However, the cost savings of detecting and preventing catastrophic failures makes pre-power diagnostics worth the development of such methods.

At least one example embodiment provides a drive system including a machine including a plurality of phases and configured to generate power based on a plurality of phase currents, each respectively associated with the plurality of phases and a direct current (DC) bus, operatively connected to the machine. The DC bus includes a high-side line, a low-side line, and an inverter including a plurality of switching systems, operatively connected between the high-side line and the low-side line, the plurality of switching systems, each configured to output a respective one of the plurality of phase currents. The drive system also includes a controller, operatively connected to the DC bus and the machine, the controller configured to determine if a failure exists in the drive system based on the plurality of phase currents and a DC bus voltage, the DC bus voltage being a voltage across the high-side line and the low-side line.

At least another example embodiment provides a drive system including, a machine including a plurality of phases and configured to generate power based on a plurality of phase currents, each respectively associated with the plurality of phases and a direct current (DC) bus, operatively connected to the machine. The DC bus includes a high-side line, a low-side line, and an inverter including a plurality of switching systems, operatively connected between the high-side line and the low-side line, the plurality of switching systems, each configured to output a respective one of the plurality of phase currents and a voltage. The drive system also includes a controller operatively connected to the DC bus and the machine, the controller configured to respectively apply voltages to the plurality of switching systems, the output voltages of the plurality of phase currents respectively based on the applied voltages. The controller includes an analog-to-digital converter (ADC) configured to measure voltages output by the plurality of switching systems, generate count data based on the measured voltages. The controller is configured to determine if a failure exists in the drive system based on the count data.

At least another example embodiment discloses a computer readable medium, when run on a computer, configured to instruct the computer to, determine if a failure exists in a drive system based on the plurality of phase currents and a DC bus voltage. The drive system includes a machine including a plurality of phases and configured to generate power based on a plurality of phase currents, each respectively associated with the plurality of phases, a direct current (DC) bus, operatively connected to the machine. The DC bus includes a high-side line, a low-side line, the DC bus voltage being a voltage across the high-side line and the low-side line, and an inverter including a plurality of switching systems, operatively connected between the high-side line and the low-side line, the plurality of switching systems, each configured to output a respective one of the plurality of phase currents.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a diagrammatic view showing a drive system for a vehicle according to an example embodiment;

FIG. 2 is a diagrammatic view of electrical and control portions of the drive system of FIG. 1 and current measurements according to an example embodiment;

FIG. 3 is an enlarged diagrammatic view showing power flow through a section of a power inverter when supplying positive and negative current to a motor according to an example embodiment;

FIG. 5 is a diagrammatic view of electrical portions of a drive system and current measurements used for a PM or Induction machine according to an example embodiment; and FIG. 6 is a diagrammatic view of electrical portions of a drive system and current measurements used for a SR machine system according to an example embodiment.

DETAILED DESCRIPTION

Figure 1:
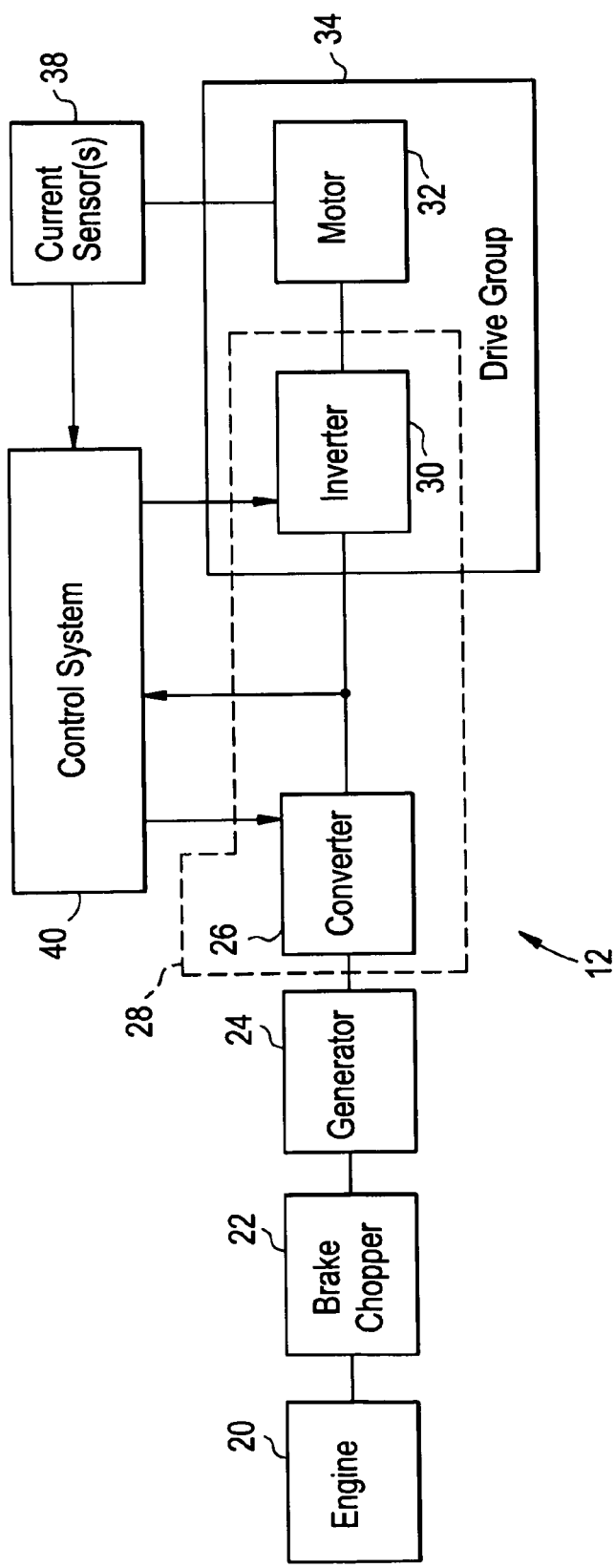

Various example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), digital signal processors (DSPs), application-specific-integrated-circuits, field programmable gate arrays (FPGAs) computers or the like. It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of example embodiments are typically encoded on some form of tangible (or recording) storage medium or implemented over some type of transmission medium. The tangible storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. Example embodiments are not limited by these aspects of any given implementation.

FIG. 1 illustrates an inverter-fed drive system 12 for an electric or hybrid vehicle to have an engine 20 (e.g., internal combustion engine), a generator 24 coupled to the engine 20, and a direct current (DC) bus 28 coupled electrically between the generator 24 and a motor 32. The engine 20 provides motive power for a vehicle. Typically, the generator 24 may take the form of a high-speed three-phase interior-permanent-magnet brushless synchronous generator having three phase windings, or other suitable form. The motor 32 may be a switched reluctance (SR) motor, a Permanent Magnet (PM) AC Motor or an Induction AC Motor.

The drive system 12 of example embodiments is well suited for diagnosing, identifying and classifying a failure of an inverter (e.g., a power inverter 30) in real-time or during an operational mode of the inverter, as opposed to a pre-test non-operational mode. In the operational mode, the inverter (e.g., power inverter 30) is capable of converting direct current into one or more alternating current signals for application to a machine 177 or motor for control of the machine or motor 32. In the test mode, the inverter does not provide or output one or more alternating current signals for application to a machine or motor 32.

The DC bus 28 may have a converter 26 coupled electrically between the generator 24 and the motor 32 to convert alternating current (AC) power into DC power during a generation operating mode of the generator 24 (i.e. conversion of mechanical energy from the power source into electric energy for supply onto the DC bus 28), and DC power into AC power during motoring of the generator 24 (i.e. removing electric energy from the DC bus 28 and converting it into mechanical energy for the power source). The DC bus 28 may have the power inverter 30 (e.g., a multi-phase inverter) coupled electrically between the converter 26 and the motor 32 to convert DC power from the DC bus 28 into AC power during motoring of the motor 32 and to convert AC power into DC power during braking of the motor 32. The drive system 12 may include a brake chopper 22 to dissipate electric power from the DC bus 28. In vehicles with a brake chopper 22 (i.e. regenerative braking), the inverter 30 also takes power from the motor 32 during braking and stores it in batteries (not shown).

A voltage sensor 36 (shown in FIG. 2) is coupled electrically to the DC bus 28 to sense a DC bus voltage and output a DC bus voltage signal indicative thereof. A current sensor 38 is coupled electrically to the motor 32 to sense a phase current of the motor 32 and output a phase current signal indicative thereof. A control system 40 is coupled electrically to the voltage sensor 36 and the current sensor 38 to receive signals from the sensors pertaining to system operation. The drive system 12 may have a current sensor 38 for each phase of the motor 32. As such, if the motor 32 has a plurality of phases (e.g., three), the drive system 12 will typically have a plurality of current sensors (e.g., three), each current sensor 38 being coupled electrically to a respective phase of the motor 32 to sense a respective phase current of the motor 32 and output a respective phase current signal indicative thereof. The control system 40 is coupled electrically to each of the current sensors 38. Additionally, it can be appreciated that the drive system 12 can have more than one motor 32 and attached inverter 30 and current sensor(s) 38 incorporated therein, although only one is shown in FIG. 1.

Figure 2:
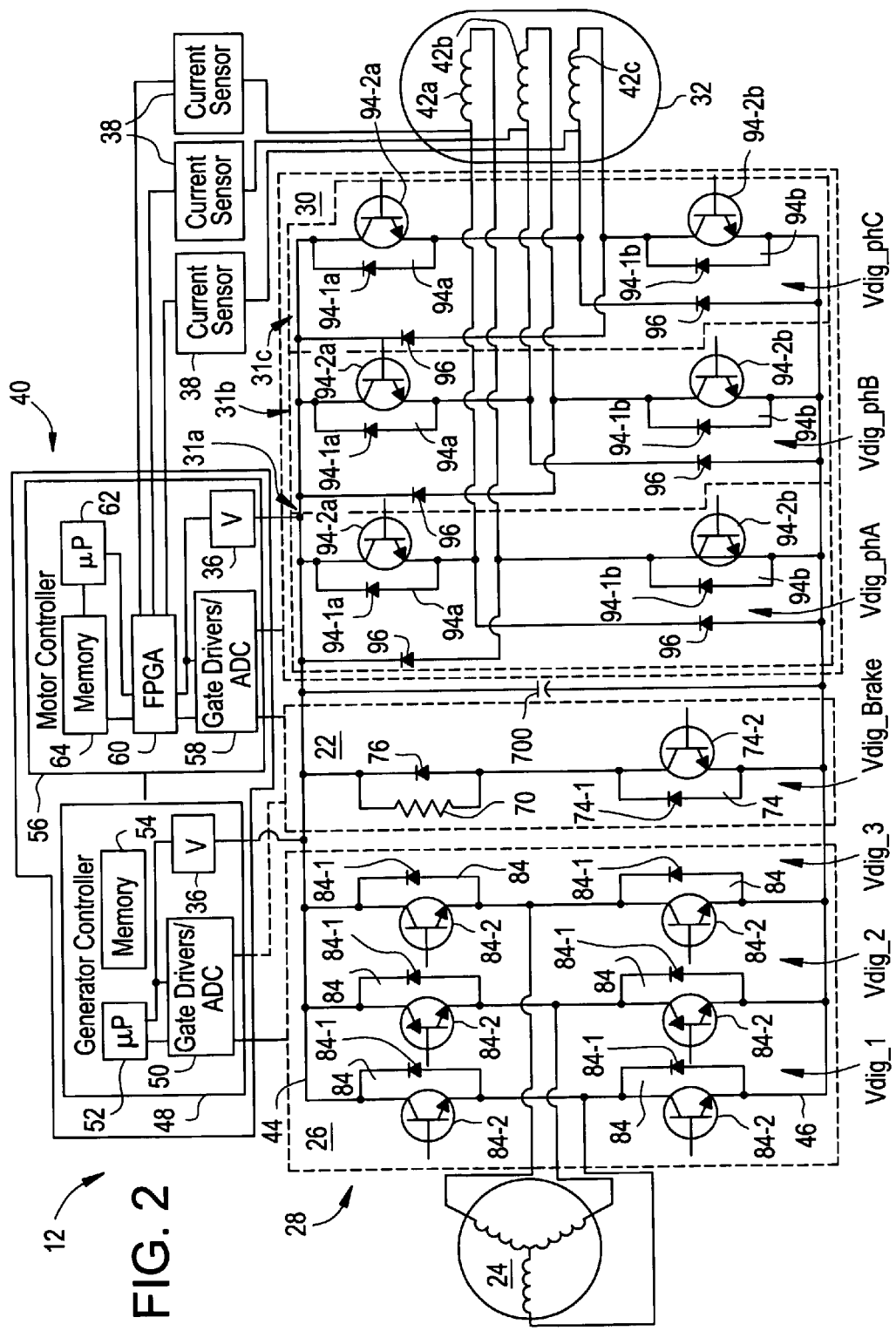

Referring to FIG. 2, details of the electrical components of the drive system 12 can be seen in greater detail. The DC bus 28 has a positive DC power rail (high-side line) 44 and a negative DC power rail (low-side line) 46. In the drive system 12 under normal operation, the nominal voltage of the DC bus 28 between the positive and negative DC power rails 44, 46 may be, for example, 700 Volts DC. However, it should be understood that the nominal voltage may be greater than or less than 700 volts DC.

The power converter 26 may be configured as an AC-DC converter to convert three-phase AC power from the generator 24, which may be a 3-phase permanent magnet (PM) generator, into DC power for the DC bus 28, and vice versa. The digital circuit voltages into the power converter 26 for the power generator 24 are denoted as Vdig_1 for the phase 1 voltage, Vdig_2 for phase 2 voltage, and Vdig_3 for phase 3 voltage. For each phase of the voltage, Vdig_1, Vdig_2 and Vdig_3, two switch packages 84 are placed across the DC supply, and are switched on and off to generate the three phases from the motor power converter 26 to the power generator 24. Each switch package 84 includes a diode 84-1 and an insulated gate bipolar junction transistor (IGBT) 84-2. Respective switch packages 84 may be coupled to a respective one of the generator 24 phase windings to convert AC power from the respective winding into DC power on the DC bus 28 between the positive DC power rail 44 and the negative DC power rail 46. When the appropriate voltage is applied to the base (gate) of an IGBT 84-2 of the power converter 26, the IGBT 84-2 may be activated and the collector may be coupled electrically to the emitter to supply electric power. The appropriate voltage depends on a rating of the IGBT 84-2. For example, 14 V may be applied at the base with respect to an emitter of the IGBT 84-2 to turn the IGBT 84-2 on. Negative 8 V may be applied at the base with respect to the emitter to turn the IGBT 84-2 off. The power converter 26 may be operated in reverse if the generator 24 is to operate as a motor.

Although IGBT refers to an insulated gate bipolar transistor, in any phase of the inverter 30, the high-side switching transistor (e.g., 94-2a) and the low-side switching transistor (e.g., 94-2b) may comprise field effect transistors, complementary metal oxide semiconductors, power transistors, or other suitable semiconductor devices.

The power converter 26 is controlled by the control system 40. A generator controller 48 of the control system 40 may have gate drivers and an analog-to-digital converter (ADC) 50, a microprocessor 52 coupled electrically to the gate drivers 50, and memory 54 coupled electrically to the microprocessor 52 and having stored therein operating instructions for the microprocessor 52. The base of each IGBT 84-2 is coupled electrically to a respective gate driver 50 that is dedicated to that IGBT 84-2 and may provide a low DC voltage (e.g., 24 VDC) to turn on and off that IGBT 84-2. Thus, there may be a gate driver 50 for each IGBT 84-2 of the power converter 26. The gate drivers 50 for the IGBT 84-2 of the power converter 26 are under the control of the microprocessor 52, which may employ a pulse-width-modulation control scheme to control those gate drivers 50 and the IGBT 84-2 of the power converter 26 to supply electric energy on the DC bus 28 in the generating mode of the generator 24 and remove electric energy from the DC bus 28 in the motoring mode of the generator 24. In example embodiments, space vector modulation may be used. However, it should be understood, that any known pulse-width-modulation scheme for drive systems may be used. Thus, for the sake of brevity, the pulse-width-modulation scheme will not be described in greater detail.

The motor 32, may be configured as a three-phase switched reluctance (SR) motor having three phase windings 42a, 42b and 42c, as shown in FIG. 2, or may be an AC PM or Induction motor (not shown). Each power inverter 30 is coupled electrically between the motor 32 and the rails 44, 46 of the DC bus 28. The power inverter 30 may be configured, for example, as a DC-AC inverter to convert DC power from the DC bus 28 into three-phase AC power for the motor 32, and vice versa. The digital circuit voltages for each of motor phase windings 42a, 42b and 42c into the power inverter 30 for the motor 32 are denoted as Vdig_phA for the phase A voltage, Vdig_phB for the phase B voltage, and Vdig_phC for the phase C voltage. For each phase of the voltage, Vdig_phA, Vdig_phB and Vdig_phC, a pair of high-side and low-side switch packages 94a, 94b are placed in series across the DC supply bus, and are switched on and off to generate the power across each phase winding.

As used in this document, switch states indicate whether a properly functioning or unimpaired semiconductor device is active ("on" or "closed") or inactive ("off" or "open"). A failure of a semiconductor device to change states may result in a semiconductor device failing in an open state or a closed state, for example.

The power inverter 30 may include pairs of high-side and low-side switch packages 94a and 94b. Each high-side switch package 94a includes a diode 94-1a, an insulated gate bipolar junction transistor (IGBT) 94-2a, and a power diode 96. Each low-side switch package 94b includes a diode 94-1b, an IGBT 94-2b and a power diode 96. Pairs of switch packages 94a, 94b may be respectively coupled electrically to the motor 32 phase windings, 42a, 42b and 42c. As such, the power inverter 30 is depicted as having three sections, 31a, 31b and 31c, each associated with one of the phase windings 42a, 42b and 42c. The sections 31a, 31b and 31c, enable individual control of each individual phase A, B and C. In this configuration, for each section 31a, 31b and 31c, a high-side switch package 94a and a low-side switch package 94b are connected across a respective motor phase winding 42a, 42b and 42c. The high-side switch package 94a is coupled electrically to the positive DC rail 44, and the low-side switch package 94b is coupled electrically to the negative DC rail 46. When the appropriate voltage is applied to the base of an IGBT 94-2a and/or 92b of the power inverter 30, the IGBT 94-2a and/or 94-2b (switch) may be activated and the collector may be coupled electrically to the emitter to supply electric power to the respective winding 42a, 42b or 42c. The power inverter 30 may be operated in reverse if the motor 32 is to operate as a generator. An example of the power flow situations is depicted in more detail in FIG. 3.

The power inverter 30 is controlled by the control system 40. A motor controller 56 of the control system 40 may have gate drivers 58, a field programmable gate array 60 (FPGA) coupled electrically to the gate drivers 58, a microprocessor (e.g., digital signal processor) 62 coupled electrically to the FPGA 60, and memory 64 coupled electrically to both the FPGA 60 and the microprocessor 62 and having stored therein operating instructions for the FPGA 60 and the microprocessor 62. The base of each IGBT 94-2a, 94-2b is coupled electrically to a respective gate driver 58 that is dedicated to that IGBT 94-2a, 94-2b and may provide a low DC voltage (e.g., 24 VDC) to turn on and off that IGBT 94-2a, 94-2b. The gate drivers 58 are under the control of the FPGA 60 which may employ a SR-motor control scheme to control the gate drivers 58, the IGBT 94-2a, 94-2b, and thus, the motor 32 (including varying the amplitudes and frequencies to the motor windings 42a, 42b, 42c) so as to vary the torque output of the motor 32 when the motor 32 is in its motoring mode or to vary the electric generation capacity of the motor 32 when the motor 32 is in its braking mode. As previously stated, it can be appreciated that the drive system 12 can have more than one motor 32 and attached inverter 30 and current sensor(s) 38 incorporated therein, and the control system 40 may have a motor controller 56 for each power inverter 30 to control that inverter 30, although only one such inverter 30 and motor controller 56 is discussed and shown.

Optionally, the drive system 12 may include a brake chopper 22 to control use of a brake resistor 70 to dissipate electric power from the DC bus 28. The brake chopper 22 may be coupled electrically between the rails 44, 46 as shown. The digital circuit voltage into the drive system 12 from the brake chopper 22 is shown as Vdig_Brake. The brake chopper 22 may include a switch package 74, with a diode 74-1 and an insulated gate bipolar junction transistor (IGBT) 74-2 and a diode 76. The diode 76 may be in parallel with the brake resistor 70. When the appropriate voltage is applied to the base of the IGBT 74-2 of the brake chopper 22, the IGBT 74-2 may be activated and the collector may be coupled electrically to the emitter to allow dissipation of electric power through the brake resistor 70. The gate driver for the IGBT 74-2 of the brake chopper 22 issues a brake resistor control signal in the form of, for example, a pulse-width modulated voltage signal that applies the voltage to the base of the switch IGBT 74-2, the voltage signal being pulse-width modulated according to a brake duty to turn the brake resistor 70 ON, to dissipate electric energy from the DC bus 28, and OFF correspondingly.

The brake chopper 22 is controlled by the control system 40. The gate driver for the IGBT 74-2 of the brake chopper 22 may be one of the gate drivers 58 of the motor controller 56. Such gate driver 58 for the IGBT 74-2 may be under the control of the FPGA 60 of the motor controller 56 to control that gate driver 58, the IGBT 74-2, and the brake resistor 70. In other example embodiments, the gate driver for the IGBT 74-2 may be one of the gate drivers 50 of the generator controller 48. In such a case, that gate driver 50 may be under the control of the microprocessor 52 of the generator controller 48 to control that gate driver 50, the IGBT 74-2, and the brake resistor 70.

The drive system 12 may have one or more voltage sensors coupled to the positive DC rail 44 of the DC bus 28 to sense the DC bus voltage. The DC bus voltage is the voltage across the rails 44 and 46. In some example embodiments, voltage sensors are also coupled to the negative DC rail 46 of the DC bus 28 and configured to sense the phase voltages for phases A, B and C. Voltage sensors 36 may be stand-alone sensors or may be incorporated into any of the controllers 48, 56 in the control system. For example, one voltage sensor 36 may be for the generator 24 and another voltage sensor 36 may be used for motor control and pole voltage measurements. The voltage sensor 36 may send a signal to the control system 40 including the sensed DC bus voltage level.

A DC link capacitor 700 may be provided between the rails 44, 46. The capacitor 700 may be configured, for example, as a bank of capacitors.

In alternate embodiments, the windings 42a, 42b and 42c may be replaced with or represent an inductor.

Figure 3:
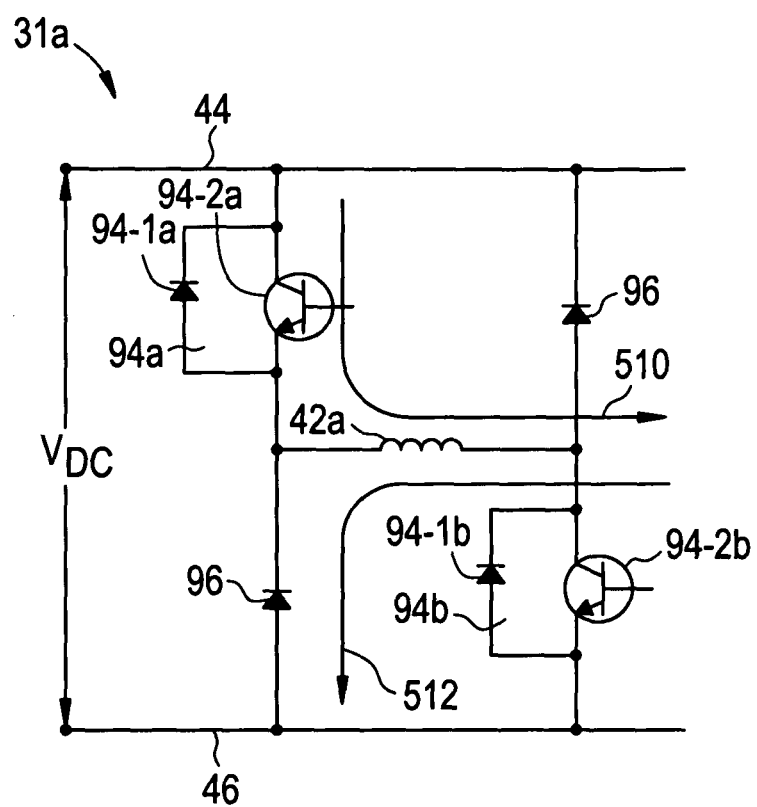

Referring now to FIG. 3, a detail of one section 31a of the power inverter 30 is shown depicting positive and negative current flow through the section 31a for a phase of the motor 32. While section 31a is illustrated in FIG. 3, it should be understood that sections 31b and 31c operate in a similar manner. Thus, for the sake of brevity, the sections 31b and 31c will not be described. In a first operational mode, i.e. supplying positive current to a phase of the motor 32, the high-side IGBT 94-2a and low-side IGBT 94-2b are turned-on, such that the phase current flows in a direction 510 through the high-side switch package 94a and low-side switch package 94b, and into the respective phase winding 42a. The power pulse is of short duration, and then the IGBT 94-2a, is switched off. Because of the inductance of the winding 42a, current continues to flow, coming in through the diode 96. It is noted that when current is quickly controlled and brought down below a threshold level then both switch packages (94a and 94b) are turned-off and current flows from the motor winding to the DC bus via low-side diode 96 and high-side diode 96. In this mode the negative DC bus voltage is applied across the motor winding. When current is slowly brought down to the threshold level then only one of any two switch packages (94a and 94b) is turned-off and current freewheels in the motor winding. In this mode zero voltage is applied across the motor winding.

In a second operational mode, i.e. supplying negative current to a phase of the motor 32, the low-side IGBT 94-2b is on, and the high-side IGBT 94-2a is closed, such that the phase current flows in a direction 512 (with exception to SR machine as in SR machine there is no current reversal through motor winding) through the low-side switch 94b, returning the trapped magnetic energy to the DC bus 28. The power pulse is of short duration, and then the IGBT 94-2b is switched off. Because of the inductance of the winding 42a, the current continues to flow, going out through the diode 96. This occurs for each of the 3 phases, A, B and C; i.e. in each section 31a, 31b and 31c.

Example embodiments utilize these features of inverter fed electric machines systems by operating the system 12 in a pre-power up low voltage mode. In one method according to an example embodiment, the control system 40 utilizes measurements of sensed signal levels to determine if there is a failure in the system. It should be understood that "signal level" may refer to either a measured phase voltage or a measured phase current. It is possible to convert a measured phase voltage to a phase current with a transconductance amplifier or transresistance amplifier (e.g., op-amplifier plus a resistor). For the sake of brevity, the first method is described using measured phase currents as the signal levels. However, it should be understood that the first method may be implemented using measured phase voltages.

Figure 5:
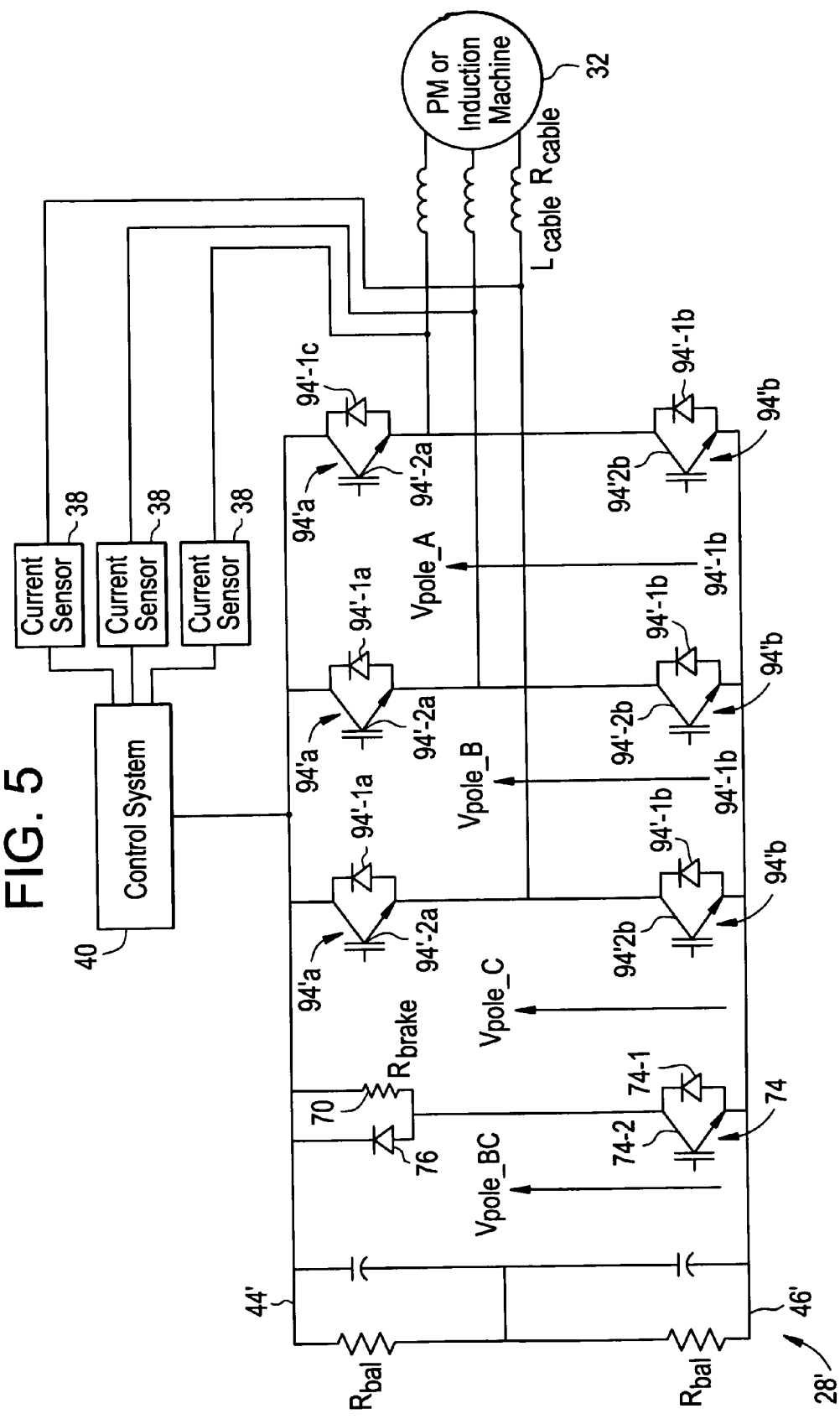
Figure 6:
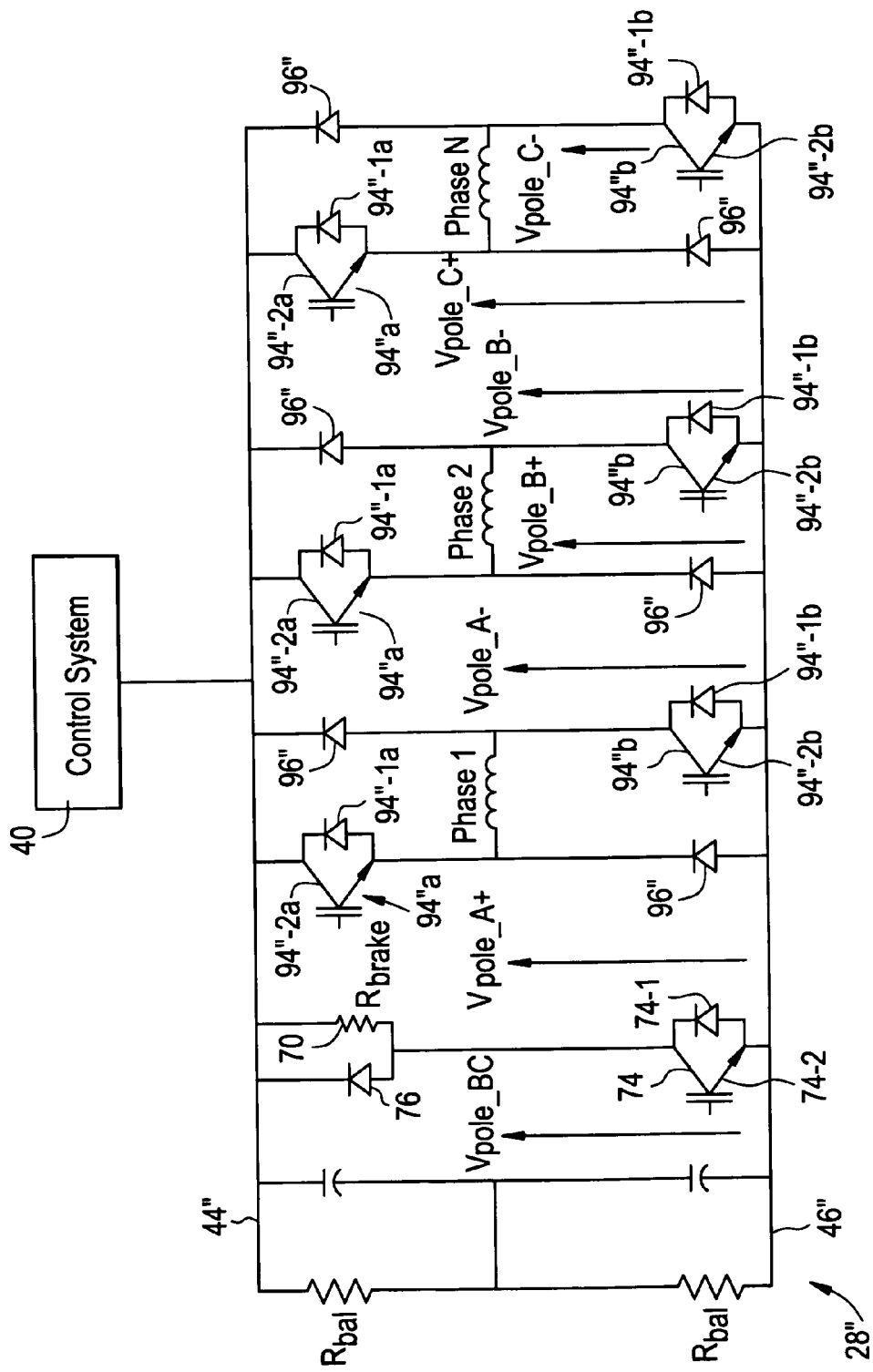

Another example embodiment utilizes measurements of sensed voltage at the AC mid-point measured between the high-side and low-side devices in an inverter leg with respect to the negative DC bus, as shown in FIGS. 5 and 6. The AC mid-point voltages are denoted as AC pole point voltages. For example, Vpole_A for the phase A AC pole point voltage, Vpole_B for phase B AC pole point voltage, Vpole_C for phase C AC pole point voltage, and if present, Vpole_BC for the brake chopper circuit. The sensed voltages are processed in the ADC 50, 58 that is built into the gate drivers (50, 58) of the control system 40. The converted digital data is sent to the relevant control board. The Vpole_A, Vpole_B, Vpole_C, Vpole_BC data is considered as ADC count data. This method compares the ADC count data to switching signals of the devices to identify and locate failures in the system.

In both methods, once the type and location of failure is determined, the control system 40 will mitigate or eliminate ill effects of occurred failure(s), and will reconfigure the drive system 12 as necessary for it to resume operation at an optimum level without further compromise in system hardware, or an error message will be relayed to indicate the failure requires repair before the drive system 12 can continue safe operation.

Figure 4A:
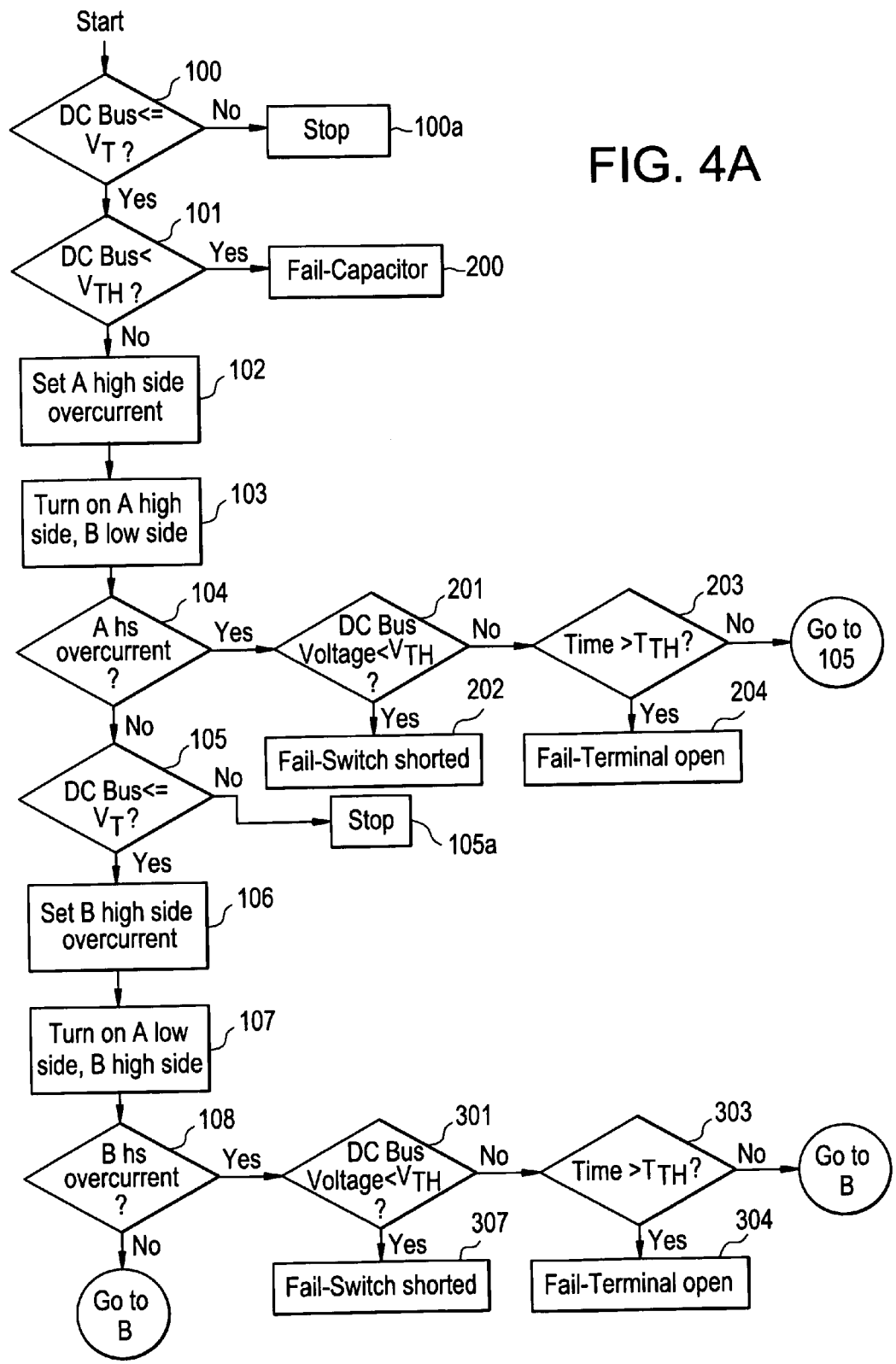
FIGS. 4A-4C illustrate flow charts of a diagnostic method according an example embodiment.
Figure 4B:
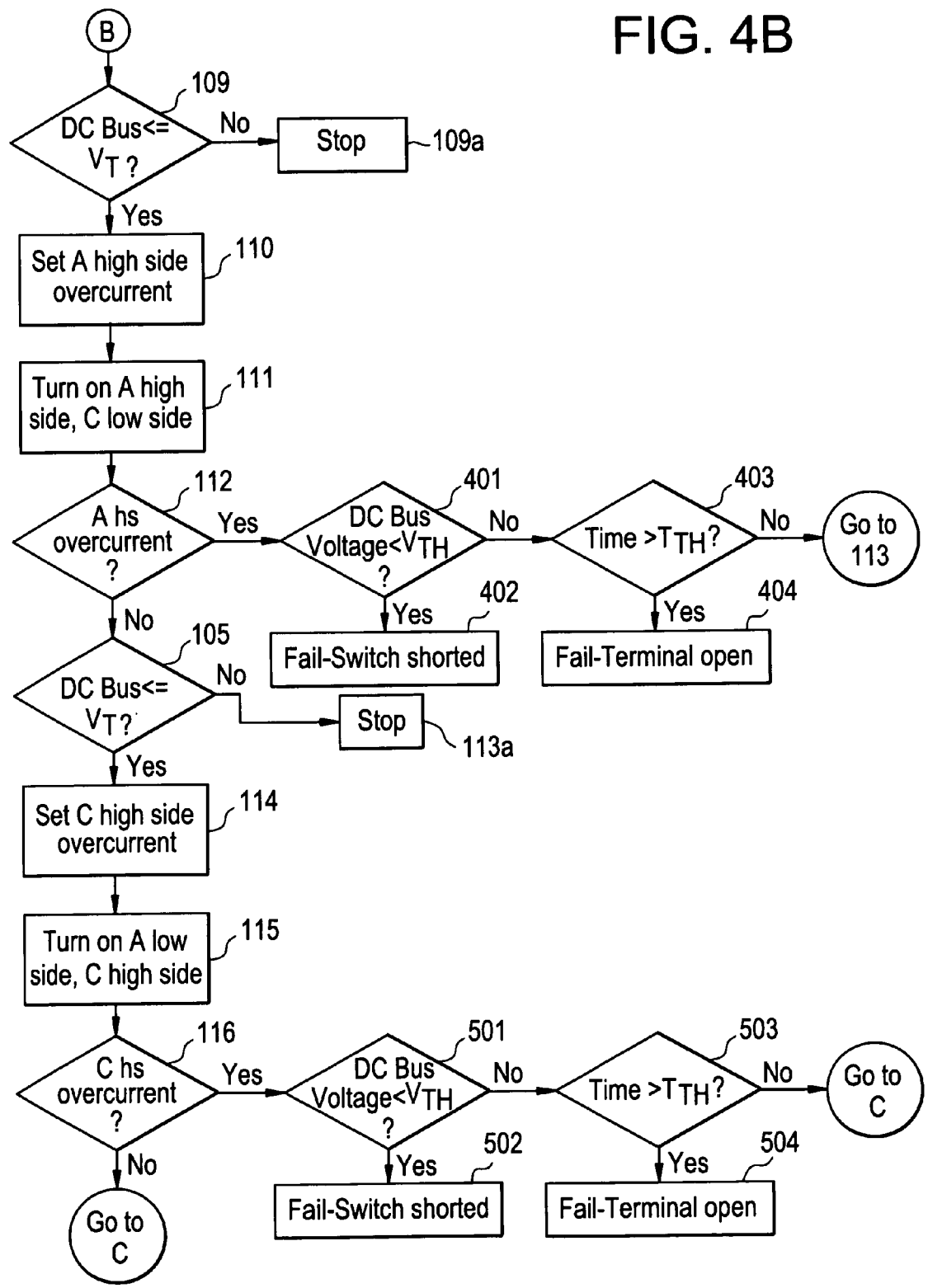
Figure 4C:
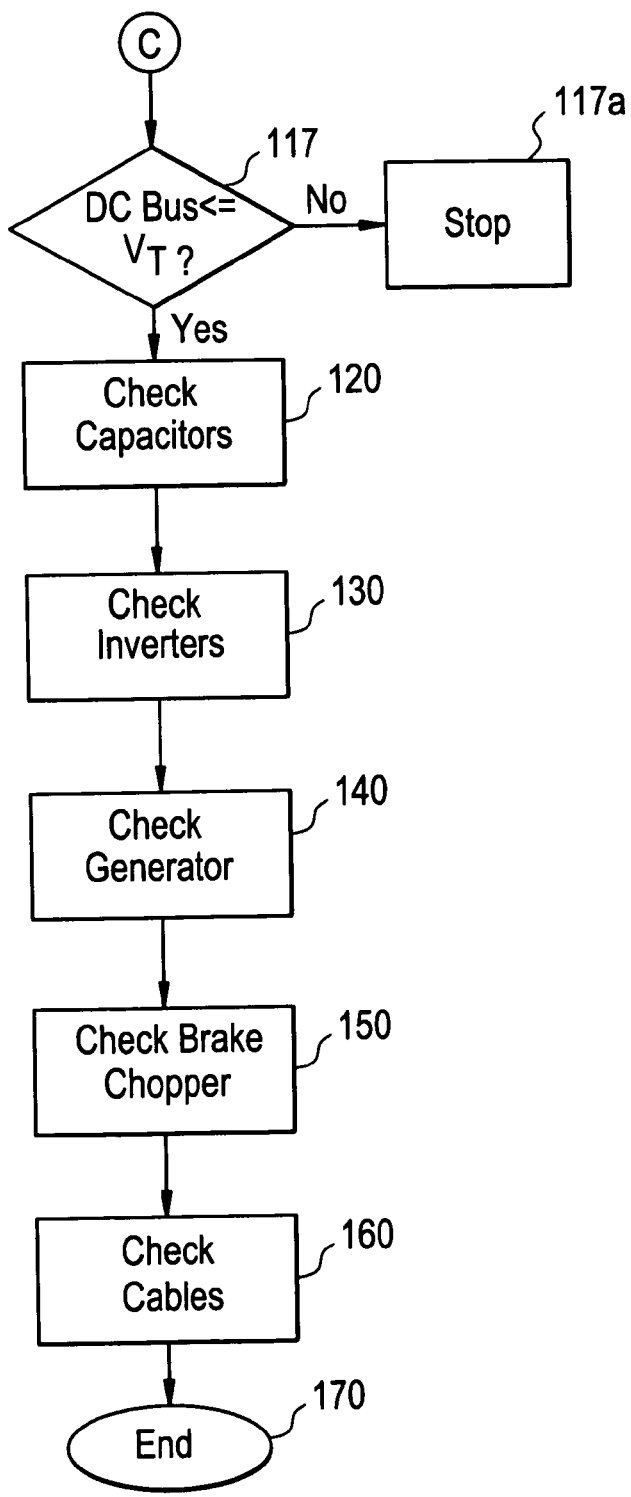

The first method according to an example embodiment is described in more detail below and shown in FIGS. 4A-4C.

At step 100, the first step in the control system 40 (diagnostic system) determines whether the DC bus is operating at a test voltage $V_T$, i.e., a low voltage used for the test mode (10 volts or less). For example, the test voltage $V_T$ may be any voltage between 10V and 25V. At a 10 V DC bus voltage, pre-power diagnosis may run slower and 25V DC bus, pre-power diagnosis runs faster. A 10 V DC bus may be used for large power inverter fed electric machines and 25 V may be used for small power inverter fed electric machines. An inductance of the motor 32 goes down as its power rating goes up. Low voltage (10 V) pre-power diagnosis may be used for a low inductance machine to reach an over current limit faster and high voltage (25 V) pre-power diagnosis may be used for a higher inductance machine.

If the DC bus is at a voltage greater than the test voltage $V_T$, the control system 40 diagnostics will not be performed at step 100a. If the DC bus is operating at or below the test voltage $V_T$ the control system 40 enters a test mode, then at step 101, the control system 40 determines if the DC bus voltage is less than a threshold voltage $V_{TH}$ (e.g., 5 volts). If the DC bus voltage is less than the threshold voltage $V_{TH}$, the control system 40 determines that a capacitor in the link capacitor 700 has failed, and at step 200 the control system 40 sends to a register an error indicating that the capacitor has failed. If the control system 40 is in the test mode, then at step 102, the control system 40 sets a phase A high-side over-current value (e.g., 10 amps). The over-current value is determined based on a permitted DC bus voltage diagnostic time of the vehicle. At step 103, the phase A high-side IGBT is set on and the phase B low-side IGBT is turned on by the control system 40.

At step 104, the control system 40 determines if there is a phase A high-side over current failure using the current sensor 38 for the phase A. If the control system 40 determines there is a phase A high-side over current failure at step 201, the control system 40 determines if the DC bus voltage has fallen below the threshold voltage $V_{TH}$. If the DC bus voltage is below the threshold voltage $V_{TH}$, this indicates that the phase A low-side IGBT is also on, due to the failure. At step 202, the control system 40 indicates that there is a shorted switch in the control system 40 and provides a system alert to the FPGA 60 about the failure. If, at step 201, the DC bus voltage has not fallen below 5 volts, then at step 203, the control system 40 monitors the phase A high-side over current to determine if the phase A high-side over current failure lasts for at least a threshold time $T_{TH}$ (e.g., 10 ms). If the phase A high-side over current lasts for at least the threshold time $T_{TH}$, then at step 204, the control system 40 determines that a system failure of an open terminal has occurred, indicating that current is not flowing, and that the machine is therefore not connected to the inverter. A system alert is provided to the FPGA 60 about the failure. If the phase A high-side over current does not last for at least the threshold time $T_{TH}$, then method proceeds to step 105.

If at step 104, if the phase A high-side over current does not experience a failure, then at step 105, the control system 40 checks to ensure the DC bus voltage is equal to or less than the test voltage $V_T$ to ensure the control system 40 is in the test mode before continuing with the pre-power test. If the DC bus voltage is not equal to or less than the test voltage $V_T$, then the control system 40 stops the method at step 105*a*. If the DC bus voltage is less than or equal to the test voltage $V_T$, then at step 106, the control system 40 sets a phase B high-side over-current value (e.g., 10 amps). At step 107, the control system 40 turns the phase A high-side IGBT and phase B low-side IGBT off, and sets the phase A low-side IGBT and the phase B high-side IGBT on.

At step 108, the control system 40 determines if there is a phase B high-side over current failure, then at step 301, the control system 40 determines if the DC bus voltage has fallen below the threshold voltage $V_{TH}$. If the DC bus voltage is below the threshold voltage $V_{TH}$, the control system 40 determines that the phase B low-side IGBT is also on, due to a failure. At step 302, the control system 40 indicates that there is a shorted switch (phase B low-side IGBT) in the drive system 12 and provides a system alert to the FPGA 60 about the failure. If, at step 301, the DC bus voltage has not fallen below 5 volts, then at step 303, the control system 40 monitors the phase B high-side over current to determine if the phase B high-side over current failure lasts for at least the threshold time $T_{TH}$. If the phase B high-side over current lasts for at least the threshold time $T_{TH}$, then at step 304, the control system 40 determines that a system failure of an open terminal has occurred, indicating that current is not flowing, and that the machine is therefore not connected to the inverter. A system alert is provided to the FPGA 60 about the failure. If the phase B high-side over current failure does not last for at least the threshold time $T_{TH}$, then the method proceeds to step 109.

At step 108, if the control system 40 determines that the phase B high-side over current does not experience a failure value, then at step 109, the control system 40 checks to ensure the DC bus voltage is equal to or less than the test voltage $V_T$ to ensure the control system 40 is in test mode before continuing with the pre-power test. If the DC bus voltage is not equal to or less than the test voltage $V_T$, then the control system 40 stops the method at step 109*a*. If the DC bus voltage is equal to or less than the test voltage $V_T$, then at step 110, the control system 40 sets the phase A high-side over-current value (e.g., 10 amps). At step 111, the phase A high-side IGBT is set on and the phase C low-side IGBT is turned on by the control system 40.

At step 112, if the control system 40 determines there is a phase A high-side over current failure, then at step 401, the control system 40 determines if the DC bus voltage has fallen below the threshold voltage $V_{TH}$. If the DC bus voltage is below the threshold voltage $V_{TH}$, the control system 40 determines that the phase A low-side IGBT is also on, due to the failure. At step 402, the control system 40 indicates that there is a shorted switch in the drive system 12 and provides a system alert to the FPGA 60 about the failure. If, at step 401, the DC bus voltage has not fallen below the threshold voltage $V_{TH}$, then at step 403, the control system 40 monitors the phase A high-side over current to determine if the phase A high-side over current failure lasts for at least the threshold time $T_{TH}$. If the phase A high-side over current failure lasts for at least the threshold time $T_{TH}$, then at step 404, the control system 40 determines that a system failure of an open terminal has occurred, indicating that current is not flowing, and that the machine is therefore not connected to the inverter. A system alert is provided to the FPGA 60 about the failure. If the phase A high-side over current failure lasts for at least the threshold time $T_{TH}$, then the method proceeds to step 113.

If at step 112, the phase A high-side over current does not experience a failure, then at step 113 the control system 40 checks to ensure the DC bus voltage is equal to or less than the test voltage $V_T$ to ensure the control system 40 is in test mode before continuing with the pre-power test. If the DC bus voltage is equal to or less than the test voltage $V_T$, the control system stops the method at step 113*a*. If the DC bus voltage is equal to or less than the test voltage $V_T$, then at step 114, the control system 40 sets a phase C high-side over-current value (e.g., 10 amps). At step 115, the control system 40 turns the phase A high-side IGBT and phase C low-side IGBTs off, and sets the phase A low-side IGBT and the phase C high-side IGBTs on.

If at step 116, the control system 40 determines there is a phase C high-side over current failure, then at step 501, the control system 40 determines if the DC bus voltage has fallen below the threshold voltage $V_{TH}$. If the DC bus voltage is less than the threshold voltage $V_{TH}$, the control system 40 determines that the phase C low-side IGBT is also on, due to the failure. At step 502, the control system 40 indicates that there is a shorted switch (e.g., phase C side IGBT 94-2*a*) in the drive system 12 and provides a system alert to the FPGA 60 about the failure. If, at step 501, the DC bus voltage has not fallen below the threshold voltage $V_{TH}$, then at step 503, the control system 40 monitors the phase C high-side over current to determine if the phase C high-side over current failure lasts for at least the threshold time $T_{TH}$. If the phase C high-side over current failure lasts for at least the threshold time $T_{TH}$, then at step 504, the control system 40 determines that a system failure of an open terminal has occurred, indicating that current is not flowing, and that the machine is therefore not connected to the inverter. A system alert is provided to the FPGA 60 about the failure. If the phase C high-side over current failure does not last for at least the threshold time $T_{TH}$, the method proceeds to step 117.

If at step 116, if the phase C high-side over current does not experience a failure value, then at step 117 the control system 40 checks to ensure the DC bus voltage is equal to or less than the test voltage $V_T$ to ensure the control system 40 is in test mode before continuing with the pre-power test. If so, then the test mode will proceed for checks of the capacitors at step 120, checks of the inverter at step 130, checks of the generator at step 140, checks of the cables at step 150, etc. If the DC bus voltage is not equal to or less than the test voltage $V_T$, the control system stops the method at step 117*a*.

If at step 117, the control system 40 determines that the DC bus voltage is not equal to at least the test voltage $V_T$, the control system 40 continues to monitor the DC bus voltage until it is equal to at least the test voltage $V_T$. If, at step 117, the DC bus voltage is still equal to the test voltage $V_T$, then the control system 40 resets the IGBTs from step 115. At step 120, the control system 40 performs a pre-power diagnostics check of the capacitors in the drive system 12. A system alert is provided to the FPGA 60 about any failures. At step 130, the control system 40 performs a pre-power diagnostics check of the system inverter 30. A system alert is provided to the FPGA 60 about any failures. At step 140, the control system 40 performs a pre-power diagnostics check of the system generator 24. A system alert is provided to the FPGA 60 about any failures. At step 150, the control system 40 performs a pre-power diagnostics check of the brake chopper system 22. A system alert is provided to the FPGA 60 about any failures. At step 160, the control system 40 performs a pre-power diagnostics check of the system cables. A system alert is provided to the FPGA 60 about any failures. When all the system pre-power diagnostics are completed successfully at step 170, and the drive system 12 appears to be operating correctly, full-power up proceeds.

A second method of failure analysis according to an example embodiment is described in more detail below and the differences in voltage measurements are shown in FIGS. 5 and 6. While FIGS. 5 and 6 are used to describe the second method, it should be understood that the systems illustrated in FIGS. 5 and 6 may be used in implementing the first method illustrated in FIGS. 4A-4C.

The second method utilizes measurements of sensed voltage at the AC mid-point measured between high-side and low-side devices in an inverter leg with respect to a negative DC bus. In example embodiments according to FIG. 5, an inverter leg may refer to a high-side switch (e.g., an IGBT in parallel with a diode) electrically connected with a low-side switch. A mid-point of an inverter leg may be referred to as an inverter pole point or AC point. These voltages are denoted as AC pole point voltages. For example, Vpole_A for the phase A AC pole point voltage, Vpole_B for phase B AC pole point voltage, Vpole_C for phase C AC pole point voltage, and if present, Vpole_BC for the brake chopper circuit. The inverter pole point is used to connect the inverter to the machine (e.g., motor). The voltages across each phrase A, B and C, of the motor winding are measured by voltage sensors (not shown).

In an SR motor system such as the SR motor system shown in FIG. 6, an inverter leg may refer to a high-side switch electrically connected with a low-side diode and may also refer to a high-side diode electrically connected with a low-side switch. The positive and negative voltages across each phrase of the motor winding are measured: i.e., a positive voltage Vpole_A+ and a negative voltage Vpole_A−. The positive and negative voltages across each phrase A, B and C, of the motor winding are measured by voltage sensors (not shown).

The sensed voltages are processed in the Analog-to-Digital Converter (ADC) that is built in to the gate driver (50, 58) of the control system 40. The converted digital data is sent to the relevant control board. The Vpole_A, Vpole_B, Vpole_C, Vpole_BC data is considered as ADC count data.

For example, the gate driver 58 may apply 0 to 5V analog signals to the IGBTs. To be in the linear range, the gate driver may use 0.5V to 4.5V. Thus, if a high-side IGBT is turned-on, voltage input to ADC will be 4.5V and if low-side IGBT is turned-on voltage input to ADC will be close to 0.5V. If no IGBT is turned-on, an inverter pole voltage will be close to 2.5V. A sensed voltage at an inverter pole point after processing by front stage remains in the range of 0.5V and 4.5V. The sensed voltage may be converted in ADC count data. For example, 4.5V may equal 921 counts for a 10 bit ADC and 0.5 V may equal 102 counts. Therefore, depending of ADC counts it can be determined weather an IGBT was turned-on. Once the IGBT is off, a voltage reading will change as current that was supplied by the IGBT will be taken over by a diode and reading to ADC will change.

This method compares the ADC count data to switching signals of the devices to identify and locate failures in the drive system 12.

FIG. 5 depicts voltage measurement for a PM or Induction AC machine for the second method of pre-power failure detection. The control system 40 is configured and connected as shown in FIG. 2. Therefore, for the sake of brevity, a description of the control system 40 will be omitted. For each phase of the voltage, Vpole_A, Vpole_B and Vpole_C, pairs of high-side and low-side packages 94'$a$ and 94'$b$ are placed across the DC bus, and are switched on and off to generate the three phases A, B and C. Each high-side switch package 94'$a$ includes a diode 94'-1$a$ and an insulated gate bipolar junction transistor (IGBT) 94'-2$a$. Each low-side switch package 94'$b$ includes a diode 94'-1$b$ and an IGBT 94'-2$b$. Respective pairs of switch packages 94'$a$, 94'$b$ may be coupled to a respective one of the phase windings between a positive DC power rail 44' and a negative DC power rail 46' of the DC bus 28'. As shown, two resistors Rbal are connected in series between the DC power rail 44' and the negative DC power rail 46' of the direct current bus 28'. The base of each IGBT 94'-2$a$, 94'-2$b$ is coupled electrically to a respective gate driver 58 that is dedicated to that IGBT 94'2$a$, 94'-2$b$ and may provide a low DC voltage (e.g., 24 VDC) to turn on and off that IGBT 94'-2$a$, 94'-2$b$. There are two possibilities of ADC count, depending upon when the switches (IGBT 94'-2$a$, 94'-2$b$) are commanded closed and/or open. These two possibilities are shown in Table 1, below for 10 bit and 12 bit ADCs.

It should be understood that Table 1, as well as Tables 2-5, may be produced from empirical data. For example, an electronic circuit may be placed between inverter pole points (with respect to negative DC bus) and an input of ADC (analog to digital converter) on gate driver boards. The electronic circuit reduces voltages at the ADC input to a max value of 5V and min value of 0V. ADC count per volt is stated as:

$$(1/(5V/2^{10}))$$

The gate driver 58 provides ADC counts to a control board and the control board determines values of pole voltages and then the pole voltages determined by control board are looked against a switch status [on or off or what has been done recently with switch(s) (IGBTs turned-on or off)] of the inverter. The developed ADC count data becomes decision criteria for the control system 40 to decide a type of failure in an inverter fed electric machine and where the failure has occurred.

The control system 40 is configured to detect the fault in the inverter (e.g., power inverter 30) if the ADC count data does not conform to one or more reference ranges (e.g. look-up Tables 1-5 below) stored in the memory 64 for corresponding switch states of the semiconductor devices. Conversely, the control system is adapted to detect the absence of fault in the inverter (e.g., power inverter 30) if the ADC count data conforms to one or more reference ranges stored in the memory 64 for corresponding switch states of the semiconductor devices.

TABLE 1

| All switches are intact and poly-phase Induction or PM AC machine is appropriately connected with inverter. | | | | | | | | |
|---|---|---|---|---|---|---|---|---|
| Switch condition in 3- | ADC count for Vpole_A | | ADC count for Vpole_B | | ADC count for Vpole_C | | ADC count for Vpole_BC | |
| ph inverter with brake chopper | 10 bit ADC | 12 bit ADC | 10 bit ADC | 12 bit ADC | 10 bit ADC | 12 bit ADC | 10 bit ADC | 12 bit ADC |
| None of switch commanded | 400 to 600 | 1500 to 2500 | 400 to 600 | 1500 to 2500 | 400 to 600 | 1500 to 2500 | 400 to 600 | 1500 to 2500 |

TABLE 1-continued

All switches are intact and poly-phase Induction or PM AC machine is appropriately connected with inverter.

| Switch condition in 3-ph inverter with brake chopper | ADC count for Vpole_A | | ADC count for Vpole_B | | ADC count for Vpole_C | | ADC count for Vpole_BC | |
|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC |
| Close A low-side IGBT | <250 | <850 | <250 | <850 | <250 | <850 | 400 to 600 | 1500 to 2500 |
| Close B low-side IGBT | <250 | <850 | <250 | <850 | <250 | <850 | 400 to 600 | 1500 to 2500 |
| Close C low-side IGBT | <250 | <850 | <250 | <850 | <250 | <850 | 400 to 600 | 1500 to 2500 |
| Close BC IGBT | 400 to 600 | 1500 to 2500 | 400 to 600 | 1500 to 2500 | 400 to 600 | 1500 to 2500 | <250 | <850 |
| Close A high-side IGBT | >800 | >3200 | >800 | >3200 | >800 | >3200 | 400 to 600 | 1500 to 2500 |
| Close B high-side IGBT | >800 | >3200 | >800 | >3200 | >800 | >3200 | 400 to 600 | 1500 to 2500 |
| Close C high-side IGBT | >800 | >3200 | >800 | >3200 | >800 | >3200 | 400 to 600 | 1500 to 2500 |

The control system 40 may determine if the ADC count does not follow the pattern shown in Table 1. If the ADC count does not follow the pattern shown in Table 1, then a failure is declared by the control system 40. There are seven different categories of failures that can be identified in the control system 40 using this detection method. The categories are as follows:

Category A: DC bus failed short,
Category B: DC bus failed open,
Category C: IGBT failed open,
Category D: IGBT failed short,
Category E: Diode failed open,
Category F: Diode failed short,
Category G: Motor cable is not connected with inverter pole Once the control system 40 determines that there is a failure in the drive system 12, the failure can be identified, as shown in Table 2.

TABLE 2

A failure exists in the inverter-fed PM or Induction AC electric machine, in either the inverter or in machine.

| Switch condition in 3-ph inverter with brake chopper | ADC count for Vpole_A | | ADC count for Vpole_B | | ADC count for Vpole_C | | ADC count for Vpole_BC | | DC bus status | Failure Category |
|---|---|---|---|---|---|---|---|---|---|---|
| | 10 bit ADC | 12 bit ADC | 10 bit ADC | 12 bit ADC | 10 bit ADO | 12 bit ADC | 10 bit ADC | 12 bit ADC | | |
| None of switches commanded | <250 | <850 | <250 | <850 | <250 | <850 | <250 | <850 | Logic low | A |
| Close A high-side IGBT | <250 | <850 | <250 | <850 | <250 | <850 | <250 | <850 | Logic low | B |
| Close B high-side IGBT | <250 | <850 | <250 | <850 | <250 | <850 | <250 | <850 | | |
| Close C high-side IGBT | <250 | <850 | <250 | <850 | <250 | <850 | <250 | <850 | | |
| Close A low-side IGBT | <250 | <850 | <250 | <850 | <250 | <850 | <250 | <850 | | |
| Close B low-side IGBT | <250 | <850 | <250 | <850 | <250 | <850 | <250 | <850 | | |
| Close C low-side IGBT | <250 | <850 | <250 | <850 | <250 | <850 | <250 | <850 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph A HS IGBT open |
| Close A high-side IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph B HS IGBT open |
| Close B high-side IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic high | C Ph C HS IGBT open |
| Close C high-side IGBT | 400 to 600 | 1500 to 2500 | 400 to 600 | 1500 to 2500 | 400 to 600 | 1500 to 2500 | 400 to 600 | 1500 to 2500 | | |

TABLE 2-continued

A failure exists in the inverter-fed PM or Induction AC electric machine, in either the inverter or in machine.

| Switch condition in 3-ph inverter with brake chopper | ADC count for Vpole_A | | ADC count for Vpole_B | | ADC count for Vpole_C | | ADC count for Vpole_BC | | DC bus status | Failure Category |
|---|---|---|---|---|---|---|---|---|---|---|
| | 10 bit ADC | 12 bit ADC | 10 bit ADC | 12 bit ADC | 10 bit ADO | 12 bit ADC | 10 bit ADC | 12 bit ADC | | |
| None of switches commanded | >800 | >3200 | >800 | >3200 | >800 | >3200 | 400 to 600 | 1500 to 2500 | One command has slow and other two have fast transition from logic high to logic low | D (i) If Vdc collapses faster with A-command, A + IGBT is failed short (ii) If Vdc collapses faster with B-command, B + IGBT is failed short (iii) If Vdc collapses faster with C-command, C + IGBT is failed short |
| Close A low-side IGBT | <250 | <850 | <250 | <850 | <250 | <850 | 400 to 600 | 1500 to 2500 | | |
| Close B low-side IGBT | <250 | <850 | <250 | <850 | <250 | <850 | 400 to 600 | 1500 to 2500 | | |
| Close C low-side IGBT | <250 | <850 | <250 | <850 | <250 | <850 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase A LS diode failed open |
| Close A high-side and B low-side | >800 | >3200 | <250 | <850 | 400 to 600 | 1500 to 2500 | 400 to 600 | 1500 to 2500 | | |
| Open A high-side and B low-side | 400 to 600 | 1500 to 2500 | >800 | >3200 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase B LS diode failed open |
| Close B high-side and C low-side | 400 to 600 | 1500 to 2500 | >800 | >3200 | <250 | <850 | 400 to 600 | 1500 to 2500 | | |
| Open B high-side and C low-side | 400 to 600 | 1500 to 2500 | 400 to 600 | 1500 to 2500 | >800 | >3200 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase C LS diode failed open |
| Close C high-side and A low-side | <250 | <850 | 400 to 600 | 1500 to 2500 | >800 | >3200 | 400 to 600 | 1500 to 2500 | | |
| Open C high-side and A low-side | >800 | >3200 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase A HS diode failed open |
| Close B high-side and A low-side | <250 | <850 | >800 | >3200 | 400 to 600 | 1500 to 2500 | 400 to 600 | 1500 to 2500 | | |
| Open B high-side and A low-side | 400 to 600 | 1500 to 2500 | <250 | <850 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase B HS diode failed open |
| Close C high-side and B low-side | 400 to 600 | 1500 to 2500 | <250 | <850 | >800 | >3200 | 400 to 600 | 1500 to 2500 | | |
| Open C high-side and B low-side | 400 to 600 | 1500 to 2500 | 400 to 600 | 1500 to 2500 | <250 | <850 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E Phase C HS Diode failed |

TABLE 2-continued

A failure exists in the inverter-fed PM or Induction AC electric machine, in either the inverter or in machine.

| Switch condition in 3-ph inverter with brake chopper | ADC count for Vpole_A | | ADC count for Vpole_B | | ADC count for Vpole_C | | ADC count for Vpole_BC | | DC bus status | Failure Category |
|---|---|---|---|---|---|---|---|---|---|---|
| | 10 bit ADC | 12 bit ADC | 10 bit ADC | 12 bit ADC | 10 bit ADO | 12 bit ADC | 10 bit ADC | 12 bit ADC | | |
| Close A high-side and C low-side | >800 | >3200 | 400 to 600 | 1500 to 2500 | <250 | <850 | 400 to 600 | 1500 to 2500 | | open |
| Open A high-side and C low-side | <250 | <850 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | E High-side diode in brake chopper IGBT module failed open |
| Close BC IGBT | 400 to 600 | 1500 to 2500 | 400 to 600 | 1500 to 2500 | 400 to 600 | 1500 to 2500 | >800 | >3200 | | |
| Open BC IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | C Brake chopper IGBT failed open |
| Close BC IGBT | 400 to 600 | 1500 to 2500 | 400 to 600 | 1500 to 2500 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase B of electric machine is not connected with inverter |
| Close A high-side | >800 | >3200 | 400 to 600 | 1500 to 2500 | >800 | >3200 | 400 to 600 | 1500 to 2500 | | |
| Close A low-side | <250 | <850 | 400 to 600 | 1500 to 2500 | <250 | <850 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase C of electric machine not connected with inverter |
| Close B high-side | >800 | >3200 | >800 | >3200 | 400 to 600 | 1500 to 2500 | 400 to 600 | 1500 to 2500 | | |
| Close B low-side | <250 | <850 | <250 | <850 | 400 to 600 | 1500 to 2500 | 400 to 600 | 1500 to 2500 | | |
| None of switches commanded | 400 to 600 | 1500 to 2500 | 400 to 600 | 1500 to 2500 | 400 to 600 | 1500 to 2500 | 400 to 600 | 1500 to 2500 | Logic High | G Phase A of electric machine not connected with inverter |
| Close C high-side | 400 to 600 | 1500 to 2500 | >800 | >3200 | >800 | >3200 | 400 to 600 | 1500 to 2500 | | |
| Close C low-side | 400 to 600 | 1500 to 2500 | <250 | <850 | <250 | <850 | 400 to 600 | 1500 to 2500 | | |

FIG. 6 depicts voltage measurement for an SR machine for the second method of pre-power detection. The control system 40 is configured and connected as shown in FIG. 2. Thus, for the sake of brevity, a description of the control system 40 will be omitted. For each phase of the voltage, Vpole_A, Vpole_B, and Vpole_C, a pair of high-side and low-side switch packages 94"a and 94"b are placed in series across the DC supply bus, and are switched on and off to generate the power across each phase winding. Each switch package 94"a, 94"b includes a diode 94"-1a, 94"-1b, an insulated gate bipolar junction transistor (IGBT) 94"-2a, 94"-2b, and a power diode 96". The high-side switch package 94"a is coupled electrically to a positive DC rail 44" of a DC bus 28", and the low-side switch package 94"b is coupled electrically to a negative DC rail 46" of the DC bus 28". Respective pairs of switch packages 94"a, 94"b may be coupled to a respective one of the SR motor phase windings, shown in FIG. 6 as Phase 1, Phase 2 and Phase N. The base of each IGBT 94"-2a, 94"-2b is coupled electrically to a respective gate driver 58 that is dedicated to that IGBT 94"-2a, 94"-2b and may provide a low DC voltage (e.g., 24 VDC) to turn on and off that 94"-2a, 94"-2b. The gate drivers 58 are under the control of the FPGA 60 which may employ a SR-motor control scheme to control the gate drivers 58, the 94"-2a, 94"-2b, and thus the motor (including varying the amplitudes and frequencies to the motor windings), so as to vary the torque output of the motor 32. The conditions of ADC count for SR machines, for Vpole_A+, Vpole_A−, Vpole_B+, Vpole_B−, Vpole_C+, Vpole_C−, and Vpole_BC when all switch packages 94"a, 94"b are intact and the poly-phase SR machine is connected with the inverter and operating correctly are shown in Table 3, below for 10 bit and 12 bit ADCs. The SR-motor control scheme may be any known SR-motor drive scheme for drive systems. Thus, for the sake of brevity, the SR-motor control scheme will not be described in greater detail.

TABLE 3

All switches are intact and poly-phase SR machine is connected with inverter.

| Switch condition in 3-ph SR inverter with brake chopper | ADC count for Vpole_A+ | | ADC count for Vpole_A− | | ADC count for Vpole_B+ | | ADC count for Vpole_B− | | ADC count for Vpole_C+ | | ADC count for Vpole_C− | | ADC count for Vpole_BC | |
|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close A high-side IGBT | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close A low-side IGBT | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 |
| Close B high-side IGBT | 400 to 600 | 1500 to 2500 | 400 to 600 | 1500 to 2500 | >800 | >3200 | >800 | >3200 | 400 to 600 | 1500 to 2500 | 400 to 600 | 1500 to 2500 | 400 to 600 | 1500 to 2500 |
| Close B low-side IGBT | 400 to 600 | 1500 to 2500 | 400 to 600 | 1500 to 2500 | <250 | <850 | <250 | <850 | 400 to 600 | 1500 to 2500 | 400 to 600 | 1500 to 2500 | 400 to 600 | 1500 to 2500 |
| Close C high-side IGBT | 400 to 600 | 1500 to 2500 | 400 to 600 | 1500 to 2500 | 400 to 600 | 1500 to 2500 | 400 to 600 | 1500 to 2500 | >800 | >3200 | >800 | >3200 | 400 to 600 | 1500 to 2500 |
| Close C low-side IGBT | 400 to 600 | 1500 to 2500 | 400 to 600 | 1500 to 2500 | 400 to 600 | 1500 to 2500 | 400 to 600 | 1500 to 2500 | <250 | <850 | <250 | <850 | 400 to 600 | 1500 to 2500 |
| Close BC IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | >800 | >3200 |

The control system 40 may determine if the ADC count does not follow the pattern shown in Table 3. If the ADC count does not follow the pattern shown in Table 3, then a failure can be declared by the control system 40. There are seven different categories of failures that can be identified in the drive system using this detection method. The categories are as follows:

Category A': DC bus failed short,
Category B': DC bus failed open,
Category C': IGBT failed open,
Category D': IGBT failed short,
Category E': Diode failed open,
Category F': Diode failed short,
Category G': Motor cable is not connected with inverter pole Once the control system 40 has determined that there is a failure in the drive system, the control system 40 will proceed with detecting if there is a failure in the DC bus, as shown in Table 4.

TABLE 4

Detecting failure in DC bus in a poly-phase SR machine.

| Switch condition in 3-ph SR inverter with brake chopper | ADC count for Vpole_A+ | | ADC count for Vpole_A− | | ADC count for Vpole_B+ | | ADC count for Vpole_B− | | ADC count for Vpole_C+ | | ADC count for Vpole_C− | | ADC count for Vpole_BC | | DC bus status | Failure Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | No failure |
| None of switches commanded | <250 | <850 | <250 | <850 | <250 | <850 | <250 | <850 | <250 | <850 | <250 | <850 | <250 | <850 | Logic Low | A' DC bus failed short |
| Close A high-side | <250 | <850 | <250 | <850 | <250 | <850 | <250 | <850 | <250 | <850 | <250 | <850 | <250 | <850 | Logic low | Possible A' & B' DC bus failed short/open |
| Close A low-side | <250 | <850 | <250 | <850 | <250 | <850 | <250 | <850 | <250 | <850 | <250 | <850 | <250 | <850 | | |
| Close B high-side | <250 | <850 | <250 | <850 | <250 | <850 | <250 | <850 | <250 | <850 | <250 | <850 | <250 | <850 | | |
| Close B low-side | <250 | <850 | <250 | <850 | <250 | <850 | <250 | <850 | <250 | <850 | <250 | <850 | <250 | <850 | | |
| Close C high-side | <250 | <850 | <250 | <850 | <250 | <850 | <250 | <850 | <250 | <850 | <250 | <850 | <250 | <850 | | |

TABLE 4-continued

Detecting failure in DC bus in a poly-phase SR machine.

| Switch condition in 3-ph SR inverter with brake chopper | ADC count for Vpole_A+ | | ADC count for Vpole_A− | | ADC count for Vpole_B+ | | ADC count for Vpole_B− | | ADC count for Vpole_C+ | | ADC count for Vpole_C− | | ADC count for Vpole_BC | | DC bus status | Failure Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| Close C low-side | <250 | <850 | <250 | <850 | <250 | <850 | <250 | <850 | <250 | <850 | <250 | <850 | <250 | <850 | | |
| Close BC | <250 | <850 | <250 | <850 | <250 | <850 | <250 | <850 | <250 | <850 | <250 | <850 | <250 | <850 | | |

If the DC bus passes the test, there is no failure in the DC bus, and the control system 40 proceeds with identifying the location of the failure in the inverter, machine and/or cable that connects machine with inverter.

TABLE 5

Detecting failure in the SR machine Phase A with passed DC bus as stated in Table 4.

| Switch condition in 3-ph SR inverter with brake chopper | ADC count for Vpole_A+ | | ADC count for Vpole_A− | | ADC count for Vpole_B+ | | ADC count for Vpole_B− | | ADC count for Vpole_C+ | | ADC count for Vpole_C+ | | ADC count for Vpole_BC | | DC bus status | Failure Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| None of switches commanded | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | No failure in DC bus |
| None of switches commanded | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | D' and F' Phase A LS IGBT failed short Or Phase A LS diode failed short |
| None of switches commanded | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | D' and F' Phase A HS IGBT failed short Or Phase A HS diode failed short |
| Close A high-side IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | C' Phase A HS IGBT failed open |
| Close A low-side IGBT | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | C' Phase A LS IGBT failed open |
| Close A high-side and A low-side IGBTs | >800 | >3200 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | E' Phase A HS diode failed open |
| Open A high-side and keep A low-side closed | <250 | <850 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Keep A high-side open and open A low-side | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |

TABLE 5-continued

Detecting failure in the SR machine Phase A with passed DC bus as stated in Table 4.

| Switch condition in 3-ph SR inverter with brake chopper | ADC count for Vpole_A+ | | ADC count for Vpole_A− | | ADC count for Vpole_B+ | | ADC count for Vpole_B− | | ADC count for Vpole_C+ | | ADC count for Vpole_C+ | | ADC count for Vpole_BC | | DC bus status | Failure Category |
|---|---|---|---|---|---|---|---|---|---|---|---|---|---|---|---|---|
| | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | 10 bit ADC | 12 bit ADC | | |
| Close A high-side and A low-side IGBTs | >800 | >3200 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | E' Phase A LS diode failed open |
| Keep A high-side closed and open A low-side | >800 | >3200 | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Open A high-side and keep A low-side open | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | | |
| Close A high-side | >800 | >3200 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | G' Machine is not connected to pole point A+ |
| Close A low-side | 400 to 600 | 1500 to 2500 | <250 | <850 | 400 to 600 | 1500 to 2500 | 400 to 600 | 1500 to 2500 | 400 to 600 | 1500 to 2500 | 400 to 600 | 1500 to 2500 | 400 to 600 | 1500 to 2500 | Logic High | G' Machine is not connected to pole point A− |

When the analysis in Table 5 has been completed for Phase A by the control system 40, the control system 40 performs the analysis for phases B and C, with the switches (IGBTs and diodes) for phases B and C used, respectively, to get appropriate pole point voltages and ADC counts. A failure detection method for brake chopper IGBTs in SR Machines may same as stated in Table 2 above.

Any of Tables 1 through 5, inclusive, may be structured as one or more look-up tables, files, database, data records or other data structures that are stored in the memory 64 of the control system 40.

In any of the Tables, there are two illustrative possibilities or permutations of ADC count depending upon when switches (IGBTs in inverter) are commanded close and/or open. The above possibilities are stated in Table below for 10-bit or 12 bit analog to digital converter (ADC) (e.g., analog-to digital converter 14). In Tables 1 through 5, inclusive, by sensing alternating current node voltages (inverter midpoint voltage with respect negative direct current bus) and knowing ADC counts for, Vpole_A, Vpole_B, Vpole_C, and Vpole_BC, the following failures can be detected in the inverter fed electric machine systems: (1) any or pair of switching transistors (e.g., IGBTs) failed short in the inverter; (2) any switching transistor (e.g., IGBT) failed open in the inverter; (3) any diode (e.g., protective diode) failed short or failed open in the inverter; (4) any capacitor failed short; (5) any cable between inverter or machine failed short or failed open; (6) any machine winding failed short or failed open; (7) any braking circuit transistor (e.g., brake chopper IGBT) or diode failed open or failed short; and (8) brake grid resistance and/or cable failed open or failed short.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

What is claimed is:

1. A drive system comprising:
   a machine including a plurality of phases and configured to generate power based on a plurality of phase currents, each respectively associated with the plurality of phases;
   a direct current (DC) bus, operatively connected to the machine, the DC bus including,
   a high-side line,
   a low-side line, and
   an inverter including a plurality of switching systems, operatively connected between the high-side line and the low-side line, the plurality of switching systems, each configured to output a respective one of the plurality of phase currents, at least one of the plurality of switching systems includes,
   a high-side switching system operatively connected to the high-side line, the high-side switching system configured to output the phase current associated with the at least one of the plurality of switching systems, and
   a low-side switching system operatively connected to the low-side line;
   a controller, operatively connected to the DC bus and the machine, the controller configured to determine if a failure exists in the drive system based on the plurality of phase currents and a DC bus voltage, the DC bus voltage being a voltage across the high-side line and the low-side line; and
   a plurality of current sensors configured to respectively measure the plurality of phase currents and output measurement signals including the measured phase currents, the controller being configured to receive the measurement signals, wherein the controller is configured to determine an over current value for the high-side switching system, activate the high-side switching system, determine if an over current failure exists based on the measured phase current and the over current value.

2. The drive system of claim 1, wherein the controller is configured to determine if the DC bus voltage is below a threshold voltage based on the over current failure.

3. The drive system of claim 2, wherein the controller is configured to determine that the at least one of the plurality of switching systems is shorted if the DC bus voltage is below the threshold voltage based on the over current failure.

4. The drive system of claim 1, wherein the controller is configured to determine if the over current failure exceeds a threshold time.

5. The drive system of claim 4, wherein the controller is configured to determine if the inverter is operatively connected to the machine based on the over current failure.

6. The drive system of claim 1, wherein the machine is a permanent magnet (PM) motor or an induction alternating current (AC) motor.

7. A drive system comprising:
a machine including a plurality of phases and configured to generate power based on a plurality of phase currents, each respectively associated with the plurality of phases;
a direct current (DC) bus, operatively connected to the machine, the DC bus including,
a high-side line,
a low-side line, and
an inverter including a plurality of switching systems, operatively connected between the high-side line and the low-side line, the plurality of switching systems, each configured to output a respective one of the plurality of phase currents and a phase voltage; and
a controller operatively connected to the DC bus and the machine, the controller configured to respectively apply voltages to the plurality of switching systems, the phase voltages output by the plurality of switching systems respectively based on the applied voltages, the controller including,
an analog-to-digital converter (ADC) configured to measure the phase voltages output by the plurality of switching systems and generate count data based on the measured phase voltages, the count data being proportional to the measured phase voltages, and
the controller configured to determine if a failure exists in the drive system based on the count data.

8. The drive system of claim 7, wherein the controller is configured to store a table, the table including operating information representing an operation of the drive system with no failures, and the controller is configured to determine if a failure exists based on the count data and the operating information.

9. The drive system of claim 8, wherein the controller is configured to determine a type of the failure based on the count data.

10. The drive system of claim 9, wherein the controller is configured to determine the type of the failure based on the count data and a voltage of the DC bus.

11. The drive system of claim 8, wherein the machine is a permanent magnet (PM) motor or an induction alternating current (AC) motor.

12. The drive system of claim 11, wherein the controller is configured to determine a location of the failure if the controller determines that there are no failures in the DC bus.

13. The drive system of claim 8, wherein the controller is configured to determine if a failure in the DC bus exists based on the count data.

14. The drive system of claim 13, wherein the machine is a permanent magnet (PM) motor, a switched reluctance (SR) motor or an induction alternating current (AC) motor.

15. A method of operating a drive system, the method comprising:
generating, by a machine including a plurality of phases, power based on a plurality of phase currents, each respectively associated with the plurality of phases;
outputting the plurality of phase currents and phase voltages by a plurality of switching systems, respectively, the plurality of switching systems operatively connected between a high-side line and a low-side line of a direct current (DC) bus operatively connected to the machine;
applying voltages to the plurality of switching systems, respectively, the outputted phase voltages respectively based on the applied voltages;
measuring the phase voltages output by the plurality of switching systems and generating count data based on the measured phase voltages, the count data being proportional to the measured phase voltages; and
determining if a failure exists in the drive system based on the count data.

16. The method of claim 15, further comprising:
determining a type of the failure based on the count data.

17. The method of claim 16, wherein the determining a type includes determining the type based on a voltage of the DC bus.

18. The method of claim 13, further comprising:
determining a location of the failure.

* * * * *